(12) United States Patent
Shinohara et al.

(10) Patent No.: US 8,981,402 B2
(45) Date of Patent: Mar. 17, 2015

(54) WHITE LED LIGHTING DEVICE, AND OPTICAL LENS

(75) Inventors: Yoshinori Shinohara, Nagano (JP); Fumiaki Koizumi, Nagano (JP)

(73) Assignees: Nittoh Kogaku K.K. (JP); Yasuhiro Koike (JP)

( * ) Notice: Subject to any disclaimer, the term of this patent is extended or adjusted under 35 U.S.C. 154(b) by 211 days.

(21) Appl. No.: 13/521,770

(22) PCT Filed: Jan. 4, 2011

(86) PCT No.: PCT/JP2011/050006
§ 371 (c)(1),
(2), (4) Date: Jul. 12, 2012

(87) PCT Pub. No.: WO2011/089927
PCT Pub. Date: Jul. 28, 2011

(65) Prior Publication Data
US 2012/0286314 A1   Nov. 15, 2012

(30) Foreign Application Priority Data
Jan. 19, 2010   (JP) ................................. 2010-008626

(51) Int. Cl.
| | | |
|---|---|---|
| H01L 33/50 | (2010.01) | |
| H01L 33/58 | (2010.01) | |
| F21V 5/04 | (2006.01) | |
| G02B 19/00 | (2006.01) | |
| F21Y 101/02 | (2006.01) | |

(52) U.S. Cl.
CPC . *H01L 33/58* (2013.01); *F21V 5/04* (2013.01); *G02B 19/0014* (2013.01); *G02B 19/0061* (2013.01); *G02B 19/0028* (2013.01); *H01L 33/50* (2013.01); *H01L 2933/0091* (2013.01); *F21Y 2101/02* (2013.01)

USPC ............................................. 257/98; 257/100

(58) Field of Classification Search
CPC ..... H01L 33/50; H01L 33/501; H01L 33/502; H01L 33/504; H01L 33/505; H01L 33/507; H01L 33/508; H01L 33/58
USPC ...................... 757/79–100, E33.055–E33.075
See application file for complete search history.

(56) References Cited

U.S. PATENT DOCUMENTS

| | | | |
|---|---|---|---|
| 2004/0190304 A1* | 9/2004 | Sugimoto et al. ............. | 362/555 |
| 2011/0147778 A1* | 6/2011 | Ichikawa ........................ | 257/98 |

FOREIGN PATENT DOCUMENTS

| | | | |
|---|---|---|---|
| JP | 2005-216782 A | 8/2005 | |
| JP | 2007-142178 A | 6/2007 | |

(Continued)

OTHER PUBLICATIONS

International Search Report for International Application No. PCT/JP2011/050006 mailing date of Apr. 5, 2011 with English Translation.

*Primary Examiner* — Matthew W Such
*Assistant Examiner* — Scott Stowe
(74) *Attorney, Agent, or Firm* — Cantor Colburn LLP (57) ABSTRACT

Disclosed are a white LED lighting device and an optical lens used in it. The white LED lighting device comprises a white LED and an optical lens. The white LED includes: a LED chip which emits blue light; and a fluorescent material which is excited by emission light of the LED chip and converts a wavelength into fluorescence of a complementary color of blue. The optical lens is formed with a scattering light guide which is given uniform scattering power in terms of a volume. The scattering light guide includes scattering particles for the scattering efficiency in a short wavelength range of light to be higher than that in a long wavelength range of light.

7 Claims, 9 Drawing Sheets

(56) References Cited

FOREIGN PATENT DOCUMENTS

| JP | 2007-265721 A | 10/2007 |
| JP | 2009-175597 A | 8/2009 |
| JP | 2009-185120 A | 8/2009 |
| JP | 2009294652 A | 12/2009 |

* cited by examiner

WHITE LED LIGHTING DEVICE, AND OPTICAL LENS

CROSS-REFERENCE TO RELATED APPLICATIONS

The present application is a national phase of an International application No. PCT/JP2010/050006 filed on Jan. 2011, which relates to and claims priority from Japanese patent application No. 2010-008626 filed on Jan. 19, 2010. The contents of the International application and the Japanese application are incorporated herein by reference.

TECHNICAL FIELD

The present invention relates to a white LED lighting device and an optical lens and, more particularly, relates to a white LED lighting device and an optical lens which can reduce unevenness in color of illumination light.

BACKGROUND ART

Incandescent lamps and fluorescent lamps are widely used as common lighting devices. However, light sources are desired which consume a little power and take current environment issues such as reduction in $CO_2$ into account. As light sources which meet this demand, LEDs (Light Emitting Diodes) are gaining attention in recent years.

By the way, features of a LED include a small size and longevity, and a short wavelength (simple color) and strong directionality because of a point light source.

Further, one LED has a smaller amount of light than a conventional light source and a plurality of LEDs needs to be mounted in one lighting device and therefore are useful for local lighting devices such as down lights, foot lights and spot lights.

LEDs provide simple colors and, as a result, in order to obtain white light required as a light source in a lighting device, a device is made of creating white color by mixing LED monochromatic lights of a plurality of different emission colors (for example, blue color, red color and green color) or creating pseudo white light by combining a LED element which emits blue light and a fluorescent material which absorbs blue light and emits yellow light. Among these, a method is usually used which obtains white light using one type of a LED element or a fluorescent material and which mixes an emission color of a blue light emitting element and a fluorescent color of a yellow fluorescent material.

Meanwhile, conventional fluorescent lamp type down lights and dichroic halogen lamps perform optical control using light sources and reflection mirrors, and condenses light. Meanwhile, with a LED down light, by embedding a lens in each LED, it is possible to efficiently perform light condensing control as compared to using existing light sources, and make instruments thinner and smaller.

However, when a condenser lens is embedded in a LED package formed with a LED chip mounted on a body and a wavelength converting member arranged on an upper part of this LED chip, color separation and unevenness in color of emission light caused by a light emitting configuration of a LED package are produced. That is, when white light obtained by mixing an emission color of a blue light emitting element and a fluorescent color of a yellow fluorescent material is condensed by a lens and spot-radiated, an emission wavelength of blue light and an emission wavelength of yellow to greenish yellow are different, and therefore radiation areas become different due to refraction. As a result, unevenness in color which is observed particularly as a state where a strong yellow tinge is emitted in a peripheral rim area of illumination light is produced, and well-looking and uniform light cannot be obtained as illumination light.

Further, a LED structure which uses a yellow fluorescent material for a blue light emitting element has, in a directly upward direction and a circumferential direction of a light emitting element, different rates that light is converted into yellow in a fluorescent material based on a relationship of a light route through which light passes to be radiated, and has a structural problem that unevenness in color is also observed from radiation light.

In the following patent literature PTL1, there is proposed a technique of providing uniform white illumination light without unevenness in color by forming a lens having an incident concave portion on which emission light from a LED is incident and a convex center radiating surface which emits emission light to an outside.

In the patent literature PTL2, there is proposes a technique of providing expressive white color without unevenness in color tone by forming a lens having a convex light incident surface on which emission light from a LED is incident and a convex light emitting surface which is configured to emit light to an outside and have different shapes or different curvatures of a center portion and an outer peripheral portion.

CITATION LIST

Patent Literature

PTL1: JP 2005-216782 A
PTL2: JP 2005-216782 A

SUMMARY OF INVENTION

Technical Problem

The techniques described in PTL1 and PTL2 effectively function when an area of a LED light emitting portion is sufficiently small compared to a lens.

However, the techniques hardly function sufficiently when an area of a LED light emitting portion is large and lights having different wavelengths are radiated from different positions of a light emitting portion. In case of, for example, a light source in which a plurality of LEDs is aligned in an array, a size of the light source is large and lights to be radiated is also mixed in a complex fashion, so that an effect of canceling unevenness in color is insufficient.

The present invention is made in light of this situation, and an object of the present invention is to provide a white LED lighting device and an optical lens which can reduce unevenness in color of illumination light.

Solution to Problem

According to a first aspect of the present invention, a white LED lighting device includes a white LED and an optical lens arranged such that respective optical axes substantially match, wherein the white LED includes: a LED chip which emits light having a peak wavelength in a wavelength range of blue; and a fluorescent material which is excited by emission light of the LED chip and converts a wavelength into fluorescence of a color tone of yellow or greenish yellow which is a complementary color of blue; the optical lens has: a light incident portion which allows the emission light to be incident from the white LED; and a light radiating portion which emits light to an outside, and is formed with a scattering light guide which is given uniform scattering power in terms of a volume; and the scattering light guide includes scattering particles most of which have a predetermined particle diameter for the scattering efficiency upon the scattering power in a short wavelength range of light to be higher than that in a long wavelength range of light.

A particle diameter of the scattering particles may include a particle diameter of $0.75<(Q(B)/Q(R))\times(Tr/Tc)<1.25$ which is a relationship between a ratio of a color temperature Tc in a center portion and a color temperature Tr in a peripheral portion of emission light and a ratio of a scattering efficiency Q(R) in the long wavelength range and a scattering efficiency Q(B) in a short wavelength range.

The particle diameter of the scattering particles may be 2 μm to 4.5 μm.

The number of times of scattering n represented by a turbidity τ of the scattering light guide and a thickness M of the optical lens may be 0.1 to 50.

The light incident portion may have a concave shape on a side of the white LED; and a convex lens may be disposed in an upper surface of the concave shape, and a tapered surface may be formed on a side surface of the concave shape to widen toward the white LED.

A planar lens, a convex lens and a concave lens may be disposed in the light emitting surface.

A curved surface which totally reflects emission light from the white LED may be formed in a side peripheral surface of the optical lens.

According to a second aspect of the present invention, there is provided an optical lens in which a LED chip which emits light having a peak wavelength in a wavelength range of blue and a white LED including a fluorescent material which is excited by emission light of the LED chip and converts a wavelength into fluorescence of a color tone of yellow or greenish yellow which is a complementary color of blue are arranged such that respective optical axes match, wherein the optical lens has: a light incident portion which allows the emission light to be incident from the white LED; and a light radiating portion which emits light to an outside, and is formed with a scattering light guide which is given uniform scattering power in terms of a volume; and for scattering power given to the scattering light guide, a scattering particles diameter which includes a higher scattering efficiency in a short wavelength range of light than a scattering efficiency in a long wavelength range of light is selected.

According to the present invention, it is possible to provide a white LED lighting device and an optical lens which can reduce unevenness in color of illumination light.

DETAILED DESCRIPTION OF THE INVENTION

An embodiment of the present invention will be described below. The correspondence between configurations of the present invention and an embodiment disclosed in the detailed description of the invention is as follows. The following description is to show that an embodiment which supports the present invention is disclosed in the detailed description of the invention. Hence, even if there is another embodiment which comprises the claimed elements but is not disclosed in the detailed description of the invention, it does not mean that such an embodiment does not correspond to the claimed configuration. Conversely, even though an embodiment is disclosed as one which supports the claimed configuration, it does not mean that the embodiment does not correspond to another configuration than the claimed configuration.

According to a first aspect of the present invention, in a white LED lighting device (for example, a white light LED device 101 in FIG. 6A and FIG. 6B) which has a white LED (for example, a white LED 1 in FIG. 6A) and an optical lens (for example, an optical lens 111 in FIG. 6A) are disposed such that respective optical axes match, the white LED includes a LED chip (for example, a LED chip 12 in FIG. 1) which emits light having a peak wavelength in a wavelength range of blue, and a fluorescent material (for example, a fluorescent material 13a in FIG. 1) which is excited by emission light of the LED chip and converts a wavelength into a fluorescence of a color tone of yellow or greenish yellow which is complementary color of blue color, the optical lens has a light incident portion (for example, a light guide 121 in FIG. 6A) on which emission light from the white LED is incident and a light radiating portion (for example, a light radiating portion 122 in FIG. 6A and FIG. 6B) which emits light to an outside, and is formed with a scattering light guide which is given uniform scattering power in terms of a volume, and the scattering light guide includes scattering particles most of which have a predetermined particle diameter (for example, 2 μm or 3.6 μm) for the scattering efficiency upon the scattering power in a short wavelength range of light to be higher than that in a long wavelength range of light.

The light incident portion has: a concave shape (for example, a concave-shape portion 121a in FIG. 6A) on a side of the white LED; and a convex lens is disposed in an upper surface (for example, a light incident surface 121b in FIG. 6A and FIG. 6B) of the concave shape, and a tapered surface is formed on a side surface of the concave shape (for example, a light incident surface 121c in FIG. 6A) to widen toward the white LED.

Hereinafter, an embodiment of the present invention will be described in detail with reference to the drawings.

[Principle of Production of Unevenness in Color of White LED]

A principle that unevenness in color occurs in a white LED will be described.

Figure 1:
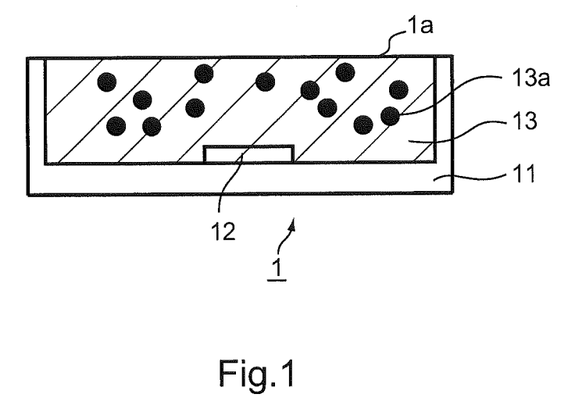
FIG. 1 is a view illustrating a configuration example of a general white LED.

FIG. 1 is a view illustrating a configuration example of a general white LED 1. With this white LED 1, a LED chip 12 which emits light having a peak wavelength in a wavelength range of blue is mounted on a printed substrate on which a conductor pattern provided in a bottom surface of a concave insulating substrate 11 is provided. In a concave portion of the insulating substrate 11, transparent resin 13 in which fluorescent materials 13a which are excited by blue light and convert wavelengths into yellow light or greenish yellow light which is a complementary color of blue is filled, and, for example, the LED chip 12 is sealed with resin and blocked from the atmosphere.

That is, with the white LED 1, part of light of the LED chip 12 is utilized to excite the fluorescent materials 13a, and white light is obtained by mixing light (blue color) from the LED chip 12 and fluorescence (greenish yellow) from the fluorescent materials 13a.

In the white LED 1 employing this configuration, a light path and a light path length of light which is emitted from the LED chip 12, is guided in the transparent resin 13 in which the fluorescent materials 13 are mixed, and reach the light emitting surface 1a are different depending on an emission direction of light emitted from the LED chip 12.

Figure 2:
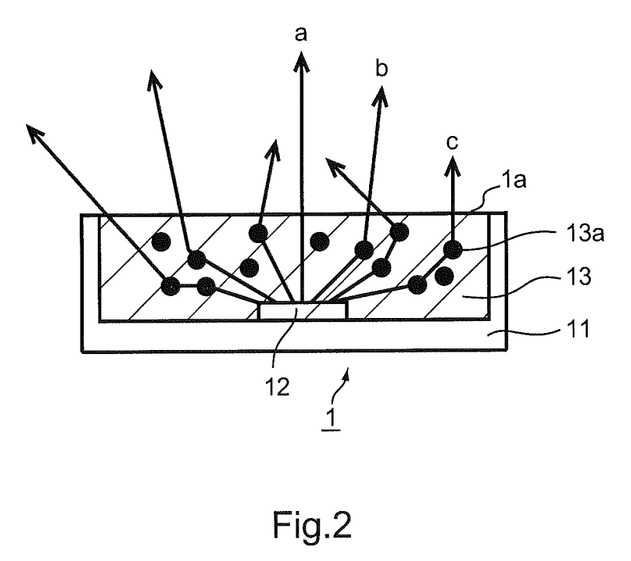
FIG. 2 is a view schematically illustrating how lights emitted from a LED chip are emitted from a white LED.

FIG. 2 is a view schematically illustrating how light emitted from the LED chip 12 is emitted from the white LED 1. That is, with this example, a light path length of light a emitted from the LED chip 12 in an optical axis X direction (above) of the LED chip 12 and passing the light path and reaching the light emitting surface 1a is shorter than a light path length of light b or light c emitted from the LED chip 12 in an obliquely upward direction and passing the light path and reaching the light emitting surface 1a.

This light path length difference means that a difference is produced in a rate a wavelength is converted by the fluorescent material 13a while light is emitted from the LED chip 12 is guided in the transparent resin 13 mixed with the fluorescent materials 13a and reaches the light emitting surface 1a. That is, the light a which has passed a short light path and reached the light emitting surface 1a has a strong color tone of blue because the rate that the wavelength is converted by the fluorescent materials 13a is small, and the light b or the light c which has passed a long light path and reached the light emitting surface 1a has a strong color tone of yellow because the rate that the wavelength is converted by the fluorescent materials 13a is high.

According to these characteristics, this white LED 1 emits white light tinged with blue in a front direction, and emits white light tinged with yellow in an obliquely upward direction. That is, the color temperature changes.

Thus, although light emitted from the white LED 1 changes the color temperature depending on a distance of the fluorescent material 13a through which light emitted from the LED chip 12 passes, light is emitted from each site of the LED chip 12 (single LED) at, for example, a wide angle of the full width at half maximum of 120 degrees, and colors are mixed and uniformly radiated. In addition, the full width at half maximum is twice an angle when luminosity becomes half of a value on a center axis of a light source. That is, a site opened 60 degrees from the center has half the lightness compared to the center.

Figure 3:
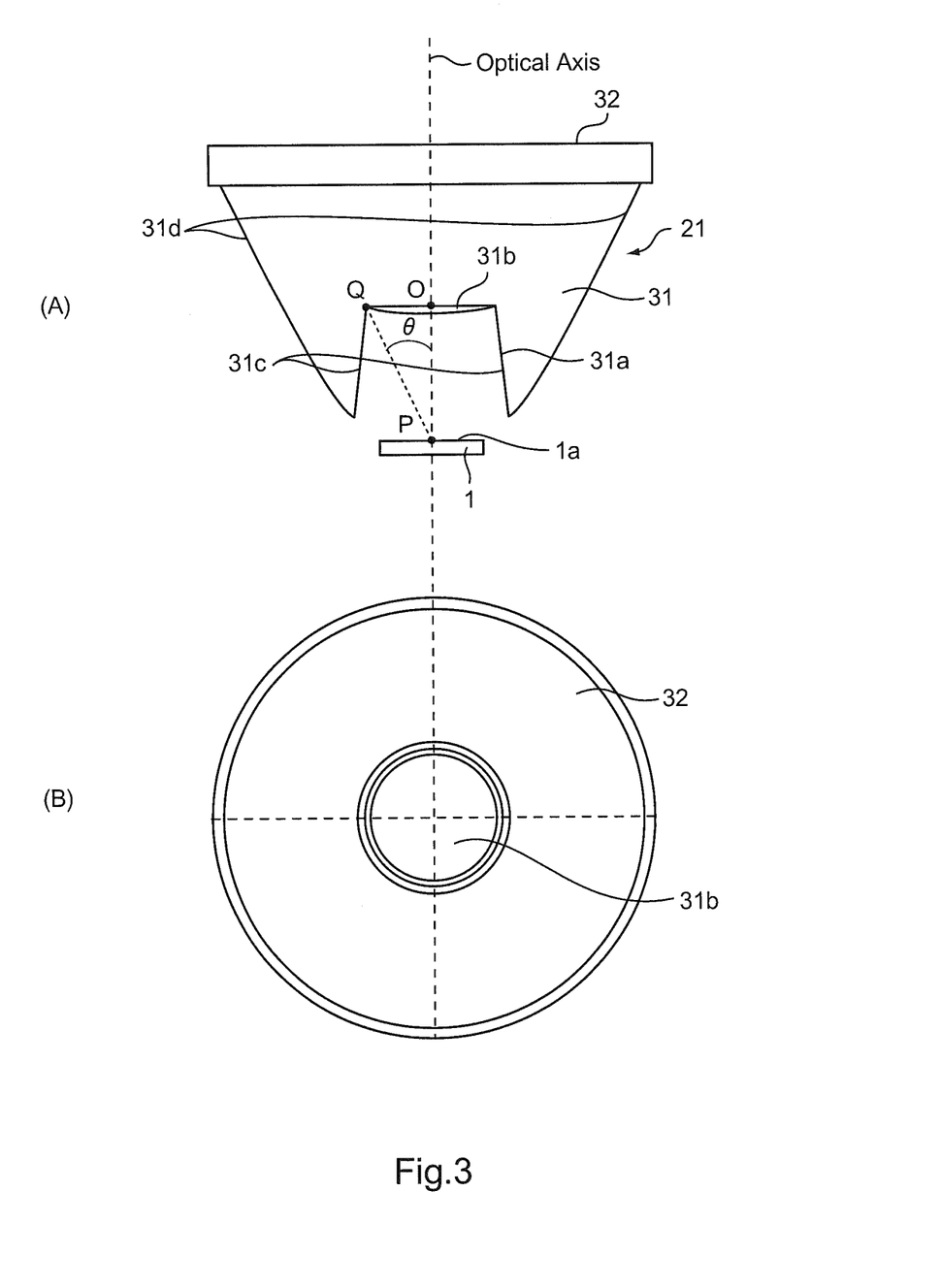
FIG. 3A to FIG. 3B are views illustrating an example of a white LED lighting device.

However, a light distribution angle of emission light needs to be a narrow angle for use in, for example, down lights. FIG. 3A and FIG. 3B are views illustrating an example of a white LED lighting device which narrows a light distribution angle of emission light by arranging an optical lens 21 formed with a transparent material above an emitting direction of light from the white LED 1. With this example, the light distribution angle is the full width at half maximum of 15 degrees.

FIG. 3A is a cross-sectional view of the white LED lighting device, and FIG. 3B is a top view seen from emission light of the white LED lighting device.

The optical lens 21 is arranged with the optical axis matching with the optical axis of the white LED 1. The optical lens 21 has an optically transmitting light guide 31 which controls a light path to guide light emitted from the white LED 1 and emit the light from a tip.

With the light guide 31, a concave-shaped portion 31a which orients a concave surface toward the white LED 1 is formed at a position opposing to the light emitting surface 1a of the white LED 1, and a convex lens is disposed in a light incident surface 31b which is a bottom surface of the concave-shaped portion 31a. The light incident surface 31b of the concave-shaped portion 31a guides in the optical lens 21 light which is emitted above from the light emitting surface 1a of the white LED 1 and which is smaller than an emission angle θ which is an angle formed between two lines of a line connecting a center portion P of the light emitting surface 1a of the white LED 1 and a center portion O of the light incident surface 31b and a line connecting the center portion P of the light emitting surface 1a of the white LED 1 and an end Q of the light incident surface 31b.

Further, in a light incident surface 31c which is a side surface of the concave-shaped portion 31a, a tapered surface is formed to widen toward the white LED 1. The light incident surface 31c of the concave-shaped portion 31a guides in the optical lens 21 light which is emitted above from the light emitting surface 1a of the white LED 1 and which is greater than an emission angle θ which is an angle formed between two lines of a line connecting a center portion P of the light emitting surface 1a of the white LED 1 and a center portion O of the light incident surface 21b and a line connecting the center portion P of the light emitting surface 1a of the white LED 1 and an end Q of the light incident surface 21b.

In the light guide 31 and a side peripheral surface of the light guide 31, a curved surface 31d is formed which totally reflects light emitted from the light emitting surface 1 of the white LED 1.

In the light guide 31, a light radiating portion 32 which radiates light incident from the light incident surfaces 31b, 31c and 31d of the concave-shaped portion 31a to an outside is formed at a position opposing to the concave-shaped portion 31a. The light radiating portion 32 is formed in a plane or a convex lens or a concave lens is disposed.

FIG. 4A to FIG. 4D show illuminance distributions and illuminance curves of emission light emitted from the optical lens 21 of the white LED lighting device in FIG. 3A and FIG. 3B. In addition, a diameter φ of the LED chip 12 of the white LED 1 is 1.0 mm, and an emission diameter from the white LED 1 is 4.3 mm.

Figure 4A:
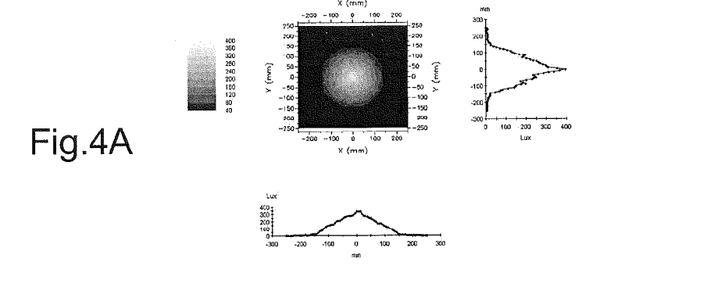
FIG. 4A to FIG. 4D are views showing illuminance distributions and illuminance curves of emission light emitted from an optical lens.

FIG. 4A shows an illuminance distribution one meter below emission light emitted from the optical lens 21 when white light obtained by mixing a LED beam emitted from the center portion (φ=1.6 mm) of the white LED 1 and fluorescence (greenish yellow) from the fluorescent materials 13a is guided to the optical lens 21. Further, at a lower part and a right part of the illuminance distribution, an illuminance curve in an X axis direction and an illuminance curve in a Y axis direction in this illuminance distribution are shown.

Figure 4B:
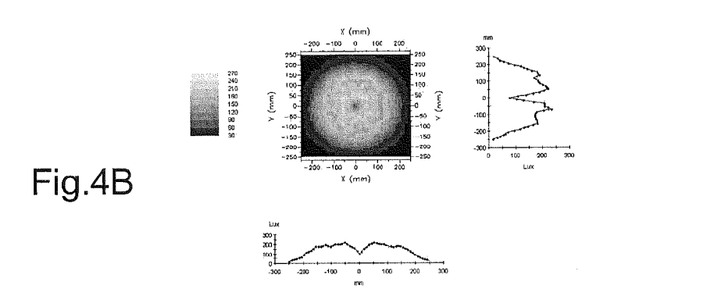

FIG. 4B shows an illuminance distribution one meter below emission light emitted from the optical lens 21 when white light obtained by mixing a LED beam emitted a range of 0.8 mm to 1.5 mm of the radius from the center portion of the white LED chip 12 and fluorescence from the fluorescent materials 13a is guided to the optical lens 21. Further, at a lower part and a right part of the illuminance distribution, an illuminance curve in the X axis direction and an illuminance curve in the Y axis direction in this illuminance distribution are shown.

Figure 4C:
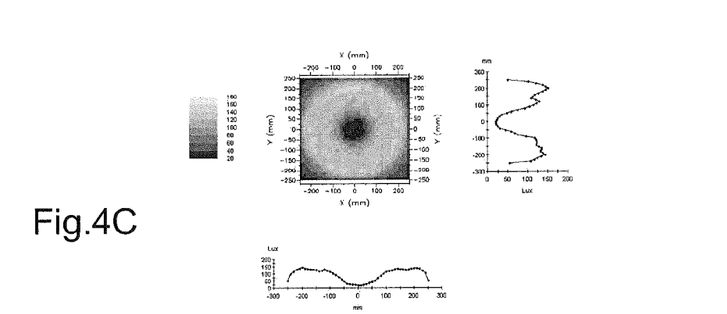

FIG. 4C shows an illuminance distribution one meter below emission light emitted from the optical lens 21 when white light obtained by mixing a LED beam emitted from a range of 1.5 mm of the radius to the periphery (4.15 mm) from the center portion of the LED chip 12 and fluorescence from the fluorescent materials 13a is guided to the optical lens 21. Further, at a lower part and a right part of the illuminance distribution, an illuminance curve in the X axis direction and an illuminance curve in the Y axis direction in this illuminance distribution are shown.

Figure 4D:
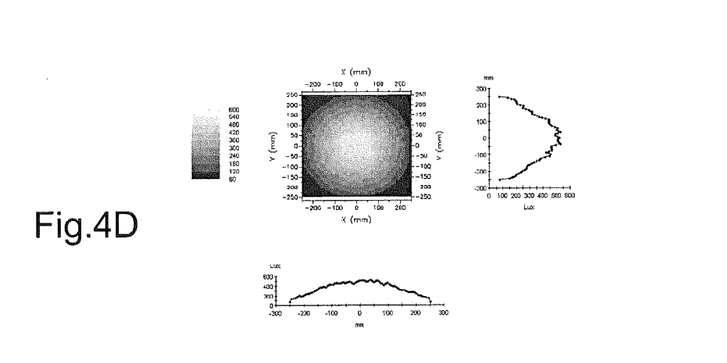

FIG. 4D shows an illuminance distribution one meter below emission light emitted from the optical lens 21 when white light obtained by mixing a LED beam emitted from the entire area of the LED chip 12 and fluorescence from the fluorescent materials 13a is guided to the optical lens 21. Further, at a lower part and a right part of the illuminance distribution, an illuminance curve in the X axis direction and an illuminance curve in the Y axis direction in this illuminance distribution are shown.

As illustrated in FIG. 4A to FIG. 4C, light emitted from a portion closer to the vicinity of the LED 12 is widened more in a donut pattern and is radiated. Further, as illustrated in FIG. 4D, in the illuminance distribution of emission light from the entire LED chip 12, the luminance is strong at the center, and becomes gradually weaker toward the periphery. That is, the illuminance distribution for a down light is an adequate distribution.

Meanwhile, from the view point of the illuminance curve, an illuminance curve of a beam of a high color temperature emitted from the center portion of the LED chip 12 intensely concentrates near the center as illustrated in FIG. 4A. By contrast with this, the illuminance curve of a beam of a low color temperature emitted from the peripheral portion of the LED chip 12 widens in a wide range as illustrated in FIG. 4C. Therefore, in an area radiated by the LED chip 12, unevenness in color is produced which produces white which has a higher color temperature and is pale blue in the center of the illuminance, and which has a lower color temperature and is tinged with yellow in the periphery.

Figure 5:
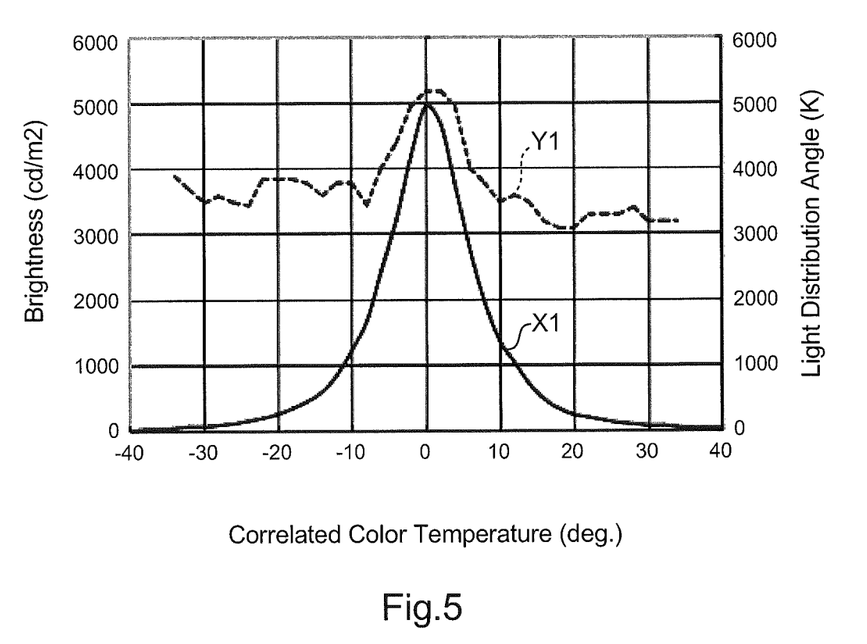
FIG. 5 is a view illustrating a measurement result of a light distribution angle distribution and a color temperature distribution of the optical lens.

FIG. 5 is a view illustrating a measurement result of a light distribution angle distribution and a color temperature distribution of the optical lens 21. In this measurement, half of a beam angle from the optical lens 21 is 13 degrees. The beam angle refers to an angle at which two points of given equal luminosity is widened with respect to the center, and, half of the beam angle is an angle at which lightness becomes half compared to the center, that is, when half of the beam angle is 13 degrees, a site opened at 13 degrees from the center has half of lightness compared to the center. In addition, half of the beam angle is also referred to as "full width at half maximum."

In FIG. 5, a vertical axis represents brightness and a correlated color temperature, and a horizontal axis represents a light distribution angle. X1 refers a brightness curve, and Y1 refers to a correlated color temperature curve.

Also, according to the measurement result illustrated in FIG. 5, with the color temperature distribution, the center portion is substantially 5200 K, the peripheral portion is substantially 3500 K and the center portion has a higher color temperature than the peripheral portion.

Thus, when light emitted from the white LED 1 is narrowed down using the optical lens 21, a color temperature difference is produced between the center portion and the peripheral portion of emission light, and unevenness in color occurs.

[White LED Lighting Device According to Embodiment of Present Invention]

Figure 6A:
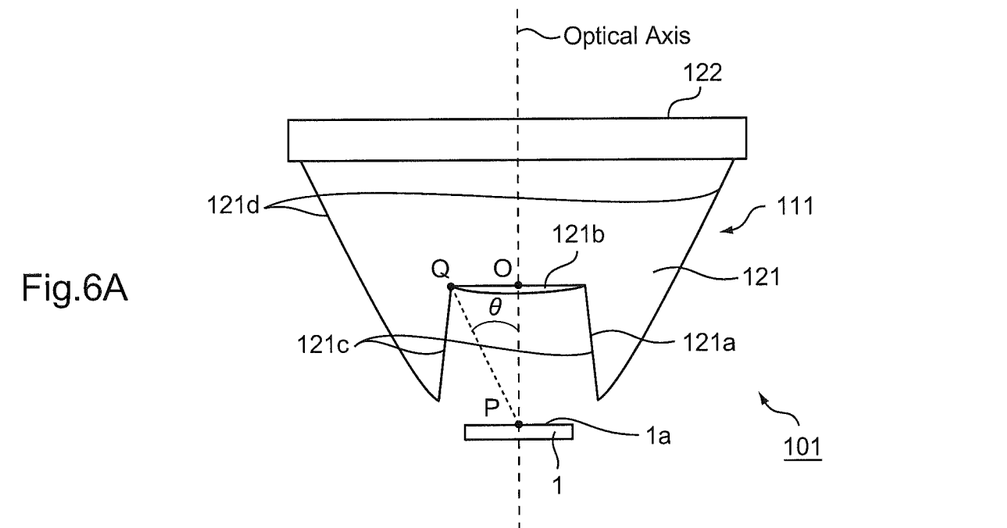
FIG. 6A and FIG. 6B are views illustrating a configuration example of a white LED lighting device according to the present invention.
Figure 6B:
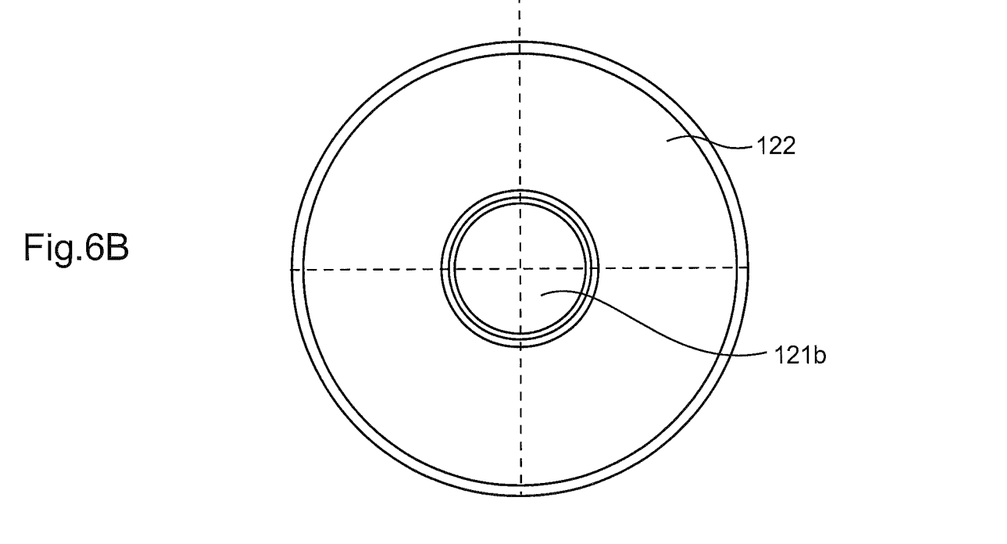

FIG. 6A and FIG. 6B are views illustrating a configuration example of a white LED lighting device 101 according to the present invention. FIG. 6A is the sectional view of a white LED lighting device 101, and FIG. 6B is a top view seen from an emission light side of the white LED lighting device 101.

The white LED lighting device 101 has the white LED 1 and an optical lens 111. The optical lens 111 has the same shape as the light guide 31 of the optical lens 21 in FIG. 3A and FIG. 3B. That is, a light guide 121 of the optical lens 111 has a concave-shaped portion 121a corresponding to the concave-shaped portion 31a of the optical lens 21 and, in the concave-shaped portion 121a, a light incident surface 121b corresponding to the light incident surface 31b of the concave-shaped portion 31a and light incident surfaces 121c corresponding to the light incident surfaces 31c are formed.

Hence, the light incident surface 121b guides in the light guide 121 light which is emitted above from the light emitting surface 1a of the white LED 1 and which is smaller than an emission angle θ which is an angle formed between two lines of a line connecting a center portion P of the light emitting surface 1a of the white LED 1 and a center portion O of the light incident surface 121b and a line connecting the center portion P of the light emitting surface 1a of the white LED 1 and an end Q of the light incident surface 121b. Meanwhile, the light incident surface 31c guides in the light guide 121 light which is greater than the emission angle θ among lights emitted above from the light emitting surface 1a of the white LED 1.

In the light guide 121, a curved surface 121d corresponding to the curved surface 31d of the optical lens 21 is also formed.

In the light guide 121, a light radiating portion 122 corresponding to the light radiating portion 32 of the optical lens 21 is formed. Light guided in the light guide 121 is emitted from the light radiating portion 122.

[Scattering Light Guide Forming Light Guide 121]

The light guide 121 is configured to have a rotary body shape about an optical axis of light emitted from the light emitting surface 1a of the white LED 1, and is a scattering light guide which is given scattering power in transparent resin (a light guide in which fine scattering particles for scattering light are kneaded and dispersed).

A material of transparent resin used for the scattering light guide includes optically transparent resin such as PET (polyethylene terephthalate), PP (polypropylene), PC (polycarbonate), PMMA (polymethylmethacrylate), benzyl methacrylate, MS resin or COP (cycloolefin polymer). For scattering particles kneaded and dispersed in the scattering light guide, particles of 1 to 10 μm such as tospearl, silicone, silica, zirconia and dielectric polymer are used.

The scattering light guide is a light guide given uniform scattering power in terms of a volume, and includes multiple spherical particles as scattering fine particles. When light is incident on an interior of the light guide 121 of the optical lens 111, light is scattered by scattering fine particles.

Mie scattering theory which gives the theoretical base of scattering fine particles will be described. Mie scattering theory is directed to finding a solution of Maxwell's equations of electromagnetism in case that there are spherical particles (scattering fine particles) having a refractive index different from a medium, in the medium (matrix) having a uniform refractive index. An intensity distribution I (A, Θ) which depends on an angle of scattering light scattered by scattering fine particles corresponding to light scattering particles is represented by equation (1), and a scattering efficiency K (A) is represented by following equation (2). A refers to a size parameter indicating an optical size of a scattering fine particle and the quantity corresponding to a radius r of a spherical particle (scattering fine particle) standardized by a wavelength λ of light in a matrix, and is represented by following equation (3). The angle Θ is a scattering angle, the same direction as a traveling direction of incident light is Θ=180 degrees.

Further, $i_1$ and $i_2$ in equation (1) are represented by following equation (4). Further, a and b with a subscript ν in equations (2) to (4) are represented by equation (5). P(cos Θ) with a superscript 1 and the subscript ν is a Legendre polynomial equation, and a and b with the subscript ν includes first and second Recatti-Bessel functions $\Psi_\nu$, $\zeta_\nu$ and a derived function thereof. "m" denotes a correlated refractive index of a scattering fine particle based on a matrix, and m=nscatter/nmatrix holds.

$$I(A, \Theta) = \frac{\lambda^2}{8\pi^2}(i_1 + i_2) \qquad (1)$$

$$K(A) = \left(\frac{2}{\alpha^2}\right)\sum_{\nu=1}^{\infty}(2\nu+1)(|a_\nu|^2 + |b_\nu|^2) \qquad (2)$$

$$A = 2\pi r/\lambda \qquad (3)$$

$$i_1 = \left|\sum_{\nu=1}^{\infty}\frac{2\nu+1}{\nu(\nu+1)}\left\{a_\nu\frac{P_\nu^1(\cos\Theta)}{\sin\Theta} + b_\nu\frac{dP_\nu^1(\cos\Theta)}{d\Theta}\right\}\right| \qquad (4)$$

$$i_2 = \left|\sum_{\nu=1}^{\infty}\frac{2\nu+1}{\nu(\nu+1)}\left\{b_\nu\frac{P_\nu^1(\cos\Theta)}{\sin\Theta} + a_\nu\frac{dP_\nu^1(\cos\Theta)}{d\Theta}\right\}\right|$$

$$a_\nu = \frac{\Psi_\nu'(mA)\Psi_\nu(A) - m\Psi_\nu(mA)\Psi_\nu'(A)}{\Psi_\nu'(mA)\zeta_\nu(A) - m\Psi_\nu(mA)\zeta_\nu'(A)} \qquad (5)$$

$$b_\nu = \frac{m\Psi_\nu'(mA)\Psi_\nu(A) - \Psi_\nu(mA)\Psi_\nu'(A)}{m\Psi_\nu'(mA)\zeta_\nu(A) - \Psi_\nu(mA)\zeta_\nu'(A)}$$

Figure 7:
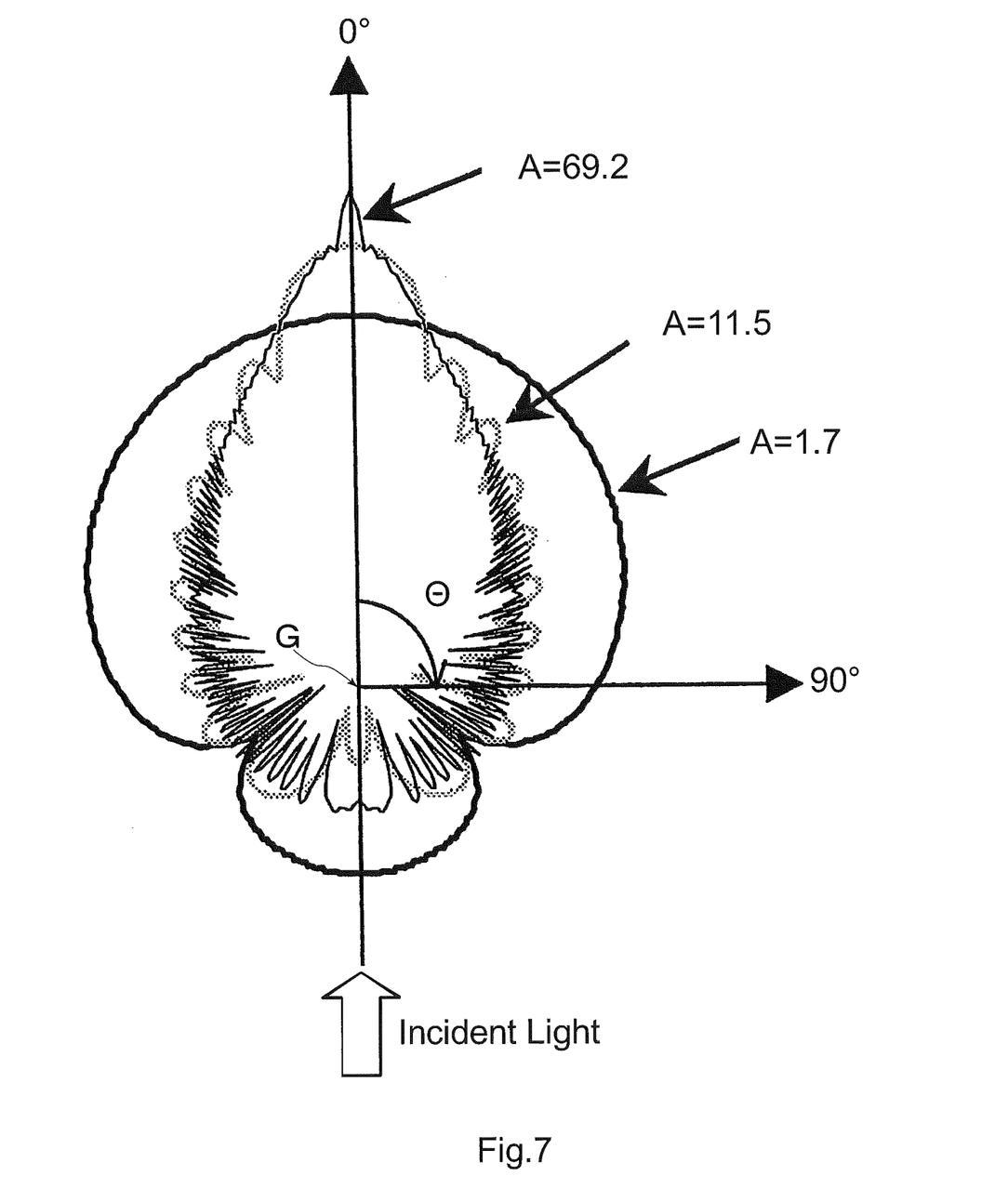
FIG. 7 is a graph illustrating an intensity distribution resulting from a single spherical particle.

FIG. 7 is a graph illustrating the intensity distribution I(A, Θ) resulting from a single spherical particle based on above equations (1) to (5). FIG. 7 shows an angle distribution I(A, Θ) of a scattering light intensity when a spherical particle which is a scattering fine particle is found at a position of an original point G, and incident light is incident from below. Further, each distance from the original point G to each of curves S1 to S3 refers to a scattering light intensity in a scattering angle direction. The curve S1 refers to a scattering light intensity when A is 1.7, the curve S2 is a scattering light intensity when A is 11.5 and the curve S3 is a scattering light intensity when A is 69.2. In addition, in FIG. 7, the scattering light intensity is indicated as a logarithmic scale. Hence, a portion which is regarded as a slight intensity difference in FIG. 7 actually becomes a significantly large difference.

As illustrated in this FIG. 7, when a size parameter A is greater (when a particle diameter of a spherical particle is greater in case of a given wavelength λ), light of high directionality is scattered above (ahead in a radiation direction). Further, actually, by fixing the incident light wavelength λ, it is possible to control the angle distribution I(A, Θ) of the scattering light intensity using the radius r of the scattering particle and the relative refractive index m of the medium and the scattering fine particle as parameters. In addition, significant scattering occurs ahead of the light guide 121.

When light is incident on such a scattering light guide including N single spherical particles, light is scattered by spherical particles. Scattering light travels in the scattering light guide, and is scattered again by other spherical particles. When particles are doped at a given volume concentration or more, this scattering is sequentially performed a plurality of times, and light is then emitted from the scattering light guide. A phenomenon that such scattering light is scattered is referred to as a "multiple scattering phenomenon." Upon multiple scattering, analysis according to a ray tracing method using transparent polymers is not easy. However, it is possible to trace a behavior of light according to the Monte Carlo method, and analyze the property. According to this, when incident light is non-polarized light, a cumulative distribution function F(θ) of a scattering angle is represented by following equation (6).

$$F(\Theta) = \frac{\int_0^\Theta I(\Theta)\sin\Theta d\Theta}{\int_0^\pi I(\Theta)\sin\Theta d\Theta} \qquad (6)$$

Meanwhile, I(θ) in equation (6) is a scattering intensity of a spherical particle of the size parameter A represented by equation (1). When light having an intensity $I_0$ is incident on the scattering light guide and transmits over a distance y, and the light intensity is scattered and attenuated to I, the relationship of these is represented by following equation (7).

$$\frac{I}{I_0} = \exp(-\tau y) \qquad (7)$$

τ in this equation (7) is referred to as "turbidity" and corresponds to a scattering coefficient of a medium, and is in proportion to the number of particles N as in following equation (8). In addition, in equation (8), $\sigma^s$ is a scattering sectional area.

$$\tau = \sigma^s N \qquad (8)$$

A probability pt(L) that light transmits through the scattering light guide of a length L based on equation (7) without being scattered is represented by following equation (9).

$$p_t(L) = \frac{I}{I_0} = \exp(-\sigma^s N L) \qquad (9)$$

By contrast with this, a probability ps(L) that light is scattered up to the light path length L is represented by following equation (10).

$$p_s(L) = 1 - p_t(L) = 1 - \exp(-\sigma^s N L) \qquad (10)$$

As is clear from these equations, by changing the turbidity τ, it is possible to control the degree of multiple scattering in the scattering light guide. For the number of times of scattering (the degree of multiple scattering) n represented by this turbidity τ and the thickness M inside the lens, 0.1<τM(=n)<50 is selected.

According to the above relationship equation, the scattering efficiency K(A) forms a function of the ratio (r/λ) of the radius r of a scattering particle and the wavelength λ. That is, it is possible to control the scattering efficiency of light of a given wavelength using the particle diameter of the scattering particle.

Figure 8:
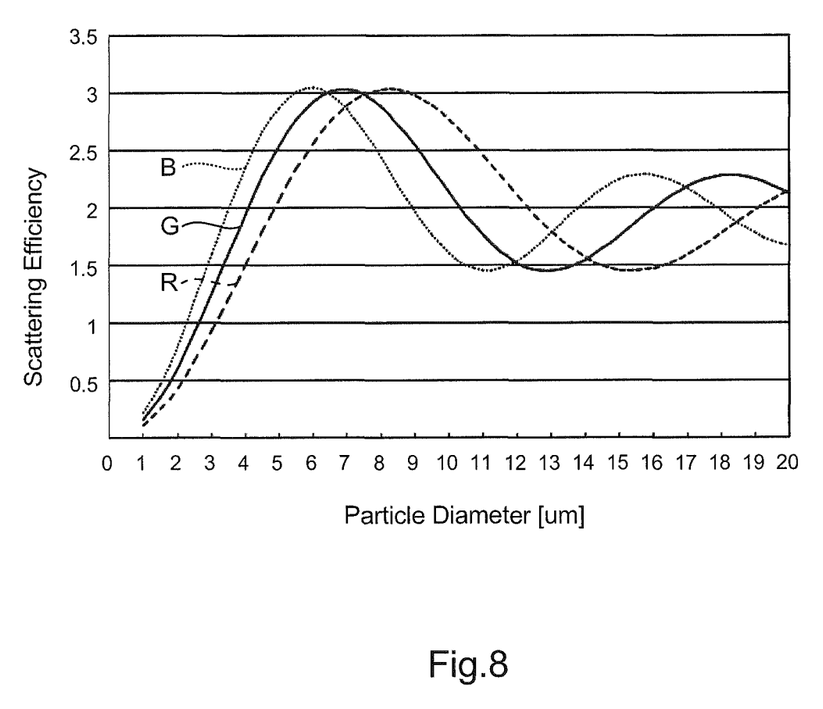
FIG. 8 is a view illustrating a relationship between a scattering particle diameter and scattering efficiency.

Further, the degree of scattering converted into a numerical value in the scattering efficiency is different depending on each beam wavelength. FIG. 8 is a view illustrating a relationship between the a scattering efficiency $Q(\lambda)$ and the scattering particle diameter of the scattering fine particle when lights having representative peaks (450 nm, 550 nm and 650 nm) of emission spectra are guided to blue (B), green (G) and red (R) which are three primary colors of light. In FIG. 8, the vertical axis indicates the scattering efficiency, and the horizontal axis indicates the scattering particle diameter of the scattering fine particle.

As illustrated in FIG. 8, although the scattering efficiency per color rises from 1, hits a peak at a given scattering particle diameter and draws an oscillating curve, this oscillating curve has a phase delay in order from B, G and R.

In a range equal to or less than 5 μm of the scattering particle diameter, the scattering efficiency of light on the short wavelength side is always higher, and a blue beam is more strongly scattered than a red beam. However, when the scattering particle diameter further increases, the scattering efficiency starts oscillating, in, for example, a given range of 8 to 11 μm, the scattering efficiency of light on the long wavelength is higher and a red beam is more likely to be strongly scattered than a blue beam, and therefore wavelength dependency of the scattering efficiency reverses.

That is, this property means that, in range equal to or less than 5 μm of the scattering particle diameter, transmission light which transmits without being scattered becomes yellowish white and scattering light to be scattered becomes pale white among lights guided to the optical lens 111 of the scattering light guide. By contrast with this, in a range of 8 to 11 μm of the scattering particle diameter, transmission light which transmits without being scattered becomes pale white, and scattering light to be scattered becomes yellowish white among lights guided to the scattering light guide lens. Further, in a specific range in an example in FIG. 8, the scattering efficiency has a substantially same value near 6.5 μm of the scattering particle diameter, and color temperatures of transmission light and scattering light are substantially the same.

[Scattering Particle Diameter of Scattering Light Guide]

According to the present embodiment, by utilizing the above property and selecting a size of a scattering particle diameter according to a wavelength of light, multiple scattering in a scattering light guide is controlled and colors of scattering light and transmission light are adequately controlled to reduce unevenness in color in the white LED lighting device 101.

For example, the light guide 121 is formed by scattering particles having a particle diameter of $0.75 < (Q(B)/Q(R)) \times (Tr/Tc)(=k) < 1.25$ which is the relationship between a ratio between a color temperature Tc in a center portion and a color temperature Tr in a peripheral portion of emission light from the light guide 31 (FIG. 3A) of the optical lens 21 having the same shape as the light guide 121 of the optical lens 111, and a ratio of the scattering efficiency Q(R) in the long wavelength range and the scattering efficiency Q(B) in the short wavelength range. In addition, Q(B) refers to the scattering efficiency in a short wavelength visible range represented by blue light, and Q(R) refers to a scattering efficiency in a long wavelength visible range represented by red light. As a result, a blue beam in the short wavelength range is more strongly scattered than a red beam in the long wavelength range.

That is, with the optical lens 21 in (FIG. 3A), transmission light of the lens is blue and this is equivalent to yellow scattering light, and therefore, with the optical lens 111 according to the present embodiment, a scattering particle diameter of the scattering light guide having an inverse property only needs to be selected. Hence, when, for example, a color temperature in the center portion of emission light from the optical lens 21 is Tc=5200 K, the color temperature in the peripheral portion is Tr=3500 K and Tr/Tc=0.67 holds, the scattering particle diameter (3.6 μm) of Q(B)/Q(R)=1.6 is selected in view of FIG. 8, and the light guide 121 of the optical lens 111 is formed using the scattering particle material having this particle diameter.

[Unevenness in Color of White LED Lighting Device 101]

By forming the light guide 121 of the optical lens 111 using a scattering particle material having a particle diameter selected based on theory, it is possible to more strongly scatter light of a short wavelength of pale blue in the center portion while light is guided in the light guide 121, and reduce unevenness in color as illustrated in FIG. 4A to FIG. 4D. That is, for example, expressive white light is formed as down light. In this case, a relationship between the scattering efficiency Q(R) in a long wavelength range and the scattering efficiency Q(B) in a short wavelength range is $(Q(B)/Q(R)) \times (Tr/Tc) = 1.1 (=k)$.

In addition, forming the light guide 121 using the scattering particle material having a predetermined particle diameter means forming the light guide 121 using a scattering particle material including the greatest number of particle diameters, for example.

FIG. 9A to FIG. 9D are views showing luminance distributions and luminance curves of emission light emitted from this optical lens 111.

FIG. 9A to FIG. 9D illustrate, for example, luminance distributions and luminance curves of emission light emitted from the optical lens 111 when the optical lens 111 formed with the scattering light guide is installed, and the light distribution angle of emission light of the lens is, for example, a narrow angle of the half width at half maximum of 15 degrees. In addition, the diameter ϕ of the LED chip 12 of the white LED 1 is 1.0 mm, and the emission diameter of the white LED 1 is 4.3 mm.

Figure 9A:
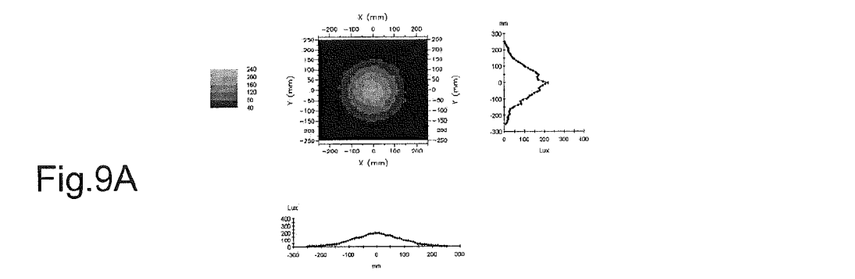
FIG. 9A to FIG. 9D are views showing luminance distributions and luminance curves of emission light emitted from the optical lens according to the present invention.

FIG. 9A shows an illuminance distribution one meter below emission light emitted from the optical lens 111 when white light obtained by mixing a LED beam emitted from the center portion (ϕ=1.6 mm) of the white LED 1 and fluorescence (greenish yellow) from the fluorescent materials 13a is guided to the optical lens 111. Further, at a lower part and a right part of the illuminance distribution, an illuminance curve in the X axis direction and an illuminance curve in the Y axis direction in this illuminance distribution are shown.

Figure 9B:
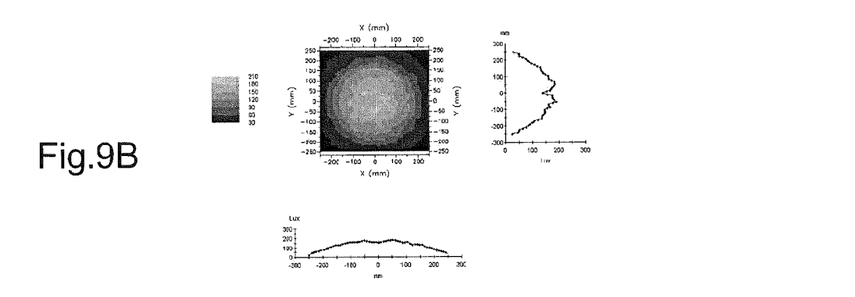

FIG. 9B shows an illuminance distribution one meter below emission light emitted from the optical lens 111 when white light obtained by mixing a LED beam emitted a range of 0.8 mm to 1.5 mm of the radius from the center portion of the white LED chip 12 and fluorescence from the fluorescent materials 13a is guided to the optical lens 111. Further, at a lower part and a right part of the illuminance distribution, an illuminance curve in the X axis direction and an illuminance curve in the Y axis direction in this illuminance distribution are shown.

Figure 9C:
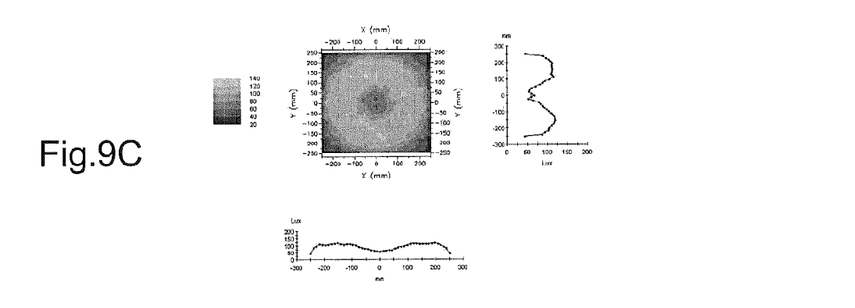

FIG. 9C shows an illuminance distribution one meter below emission light emitted from the optical lens 111 when white light obtained by mixing a LED beam emitted from a range of 1.5 mm of the radius to the periphery (4.15 mm) from the center portion of the LED chip 12 and fluorescence from the fluorescent materials 13a is guided to the optical lens 111. Further, at a lower part and a right part of the illuminance distribution, an illuminance curve in the X axis direction and an illuminance curve in the Y axis direction in this illuminance distribution are shown.

Figure 9D:
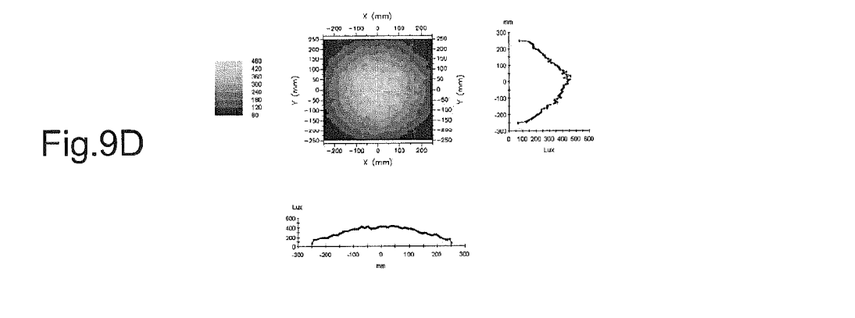

FIG. 9D shows an illuminance distribution one meter below emission light emitted from the optical lens 111 when white light obtained by mixing a LED beam emitted from the entire area of the LED chip 12 and fluorescence from the fluorescent materials 13a is guided to the optical lens 111. Further, at a lower part and a right part of the illuminance distribution, an illuminance curve in the X axis direction and an illuminance curve in the Y axis direction in this illuminance distribution are shown.

As illustrated in FIG. 9C, light emitted from the periphery of the LED chip 12 is more diffused compared to use of the optical lens 21 illustrated in FIG. 4C, and moderately widens in the entire radiation surface.

Further, as illustrated in FIG. 9D, in the illuminance distribution of emission light from the entire area of the LED chip 12, compared to use of the optical lens 21 illustrated in FIG. 4D, light from each site is diffused, and unevenness in color is reduced.

By contrast with this, in terms of the illuminance curve, an illuminance curve of a beam of a high color temperature emitted from the center portion of the LED chip 12 becomes moderate compared to use of the optical lens 21 illustrated in FIG. 4A, and an illuminance curve of a beam of a low color temperature emitted from the peripheral portion of the LED chip 12 naturally forms a moderate curve compared to use of the optical lens 21 illustrated in FIG. 4C, so that unevenness in color is reduced.

Figure 10:
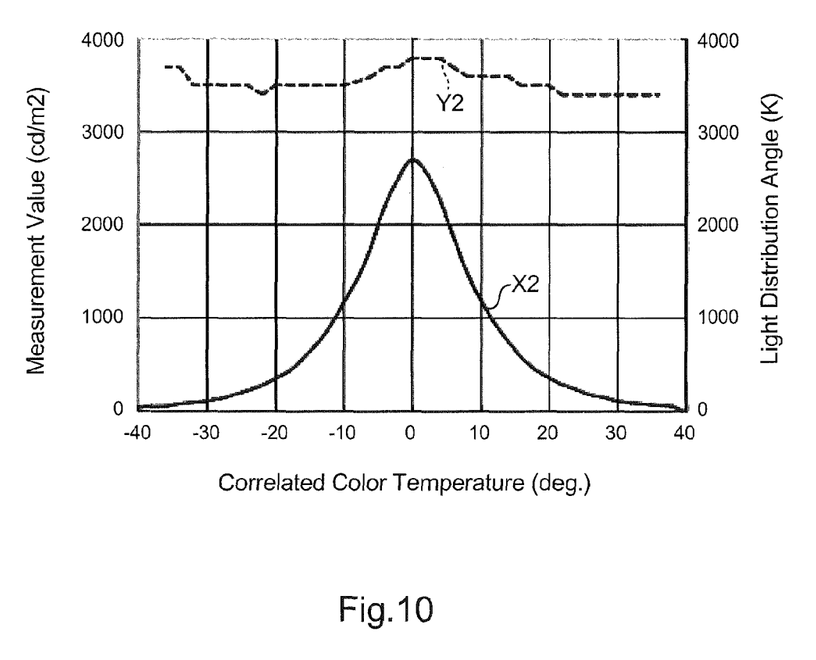
FIG. 10 is a view illustrating a measurement result of a light distribution angle distribution and a color temperature distribution of the optical lens according to the present invention.

FIG. 10 is a view illustrating a measurement result of a light distribution angle distribution and a color temperature distribution of the optical lens 111 of the white LED lighting device 101. In this measurement, half of a beam angle from the optical lens 111 is 17 degrees. That is, a site opened at 17 degrees from the center has half of lightness compared to the center. Further, the thickness of the optical lens 111 is 12 mm, and the scattering particle diameter of the scattering fine particle is 3.6 μm. Furthermore, the number of times of scattering n represented by the turbidity τ of the scattering light guide and the thickness M of the optical lens 111 is n=τM=1.16.

In FIG. 10, a vertical axis represents brightness and a correlated color temperature, and a horizontal axis represents a light distribution angle. X2 refers a brightness curve, and Y2 refers to a correlated color temperature curve.

According to the measurement result illustrated in FIG. 10, with the color temperature distribution, the color temperature in the center portion as well as the color temperature in the peripheral portion are substantially 3600 K, the color temperature difference is alleviated and light is uniformly radiated.

[Effect According to Embodiment of Invention]

As described above, by selecting a scattering particle diameter of a scattering light guide which keeps balance of the scattering efficiency between a long wavelength and a short wavelength of the scattering light guide, it is possible to minimize a decrease in the emission efficiency, correct unevenness in color temperature without substantially changing the light distribution angle and radiating expressive and uniform white light of a little unevenness in color tone.

In addition, as a white LED, a plurality of LED chips generally forms one white LED. In this case, compared to one LED chip, direction to emit blue light varies. However, scattering of light in the entire light guide 121 is controlled even in this case, so that it is possible to reduce unevenness in color even when a direction to emit blue light varies as described above.

Modified Example

1. In addition, although scattering fine particles of a single particle diameter are selected as described above, the present embodiment is by no means limited to this, scattering fine particles of a plurality of particle diameters may be mixed and used.

2. Further, as described above, by selecting scattering particle diameters which is near 3.6 μm at which the scattering efficiency Q(B) of blue light significantly exceeds the scattering efficiency Q(R) of red light and blue light is more strongly scattered than red light, unevenness in color temperature and unevenness in color tone of pale blue in the center portion of radiation light and white tinged with yellow in the peripheral portion. However, in addition to scattering particle diameters, other diameters (for example, particle diameters between 2 and 4.5 μm) may be used as long as they are equal to 5 μm or less with the example in FIG. 3A and FIG. 3B. Meanwhile, it is more effective when the ratio of the scattering efficiency of blue to the scattering efficiency of green or red is greater.

3. Further, a difference of the color temperature of light emitted from the white LED 1 varies depending on, for example, characteristics of LEDs forming the LED chip 12, fluorescent characteristics of the fluorescent materials 13a or resin 13 including fluorescent materials. Consequently, depending on, for example, these characteristics of the white LED 1, white tinged with red in the center portion of radiation light causes unevenness in color temperature and unevenness in color tone of pale blue in the peripheral portion. For this unevenness in color, for example, it is possible to select a scattering particle diameter near, for example, 9.0 μm at which the scattering efficiency Q(R) of red light significantly exceeds the scattering efficiency Q(R) of blue light and red light is more strongly scattered than blue light.

4. Further, although, as described above, unevenness in color is reduced by selecting a scattering particle diameter of a scattering light guide which keeps the balance of the scattering efficiency between a long wavelength and a short wavelength of the scattering light guide, it is possible to reduce unevenness in color by controlling the multiple scattering phenomenon. That is, it is possible to reduce unevenness in color by changing the turbidity τ.

Figure 11:
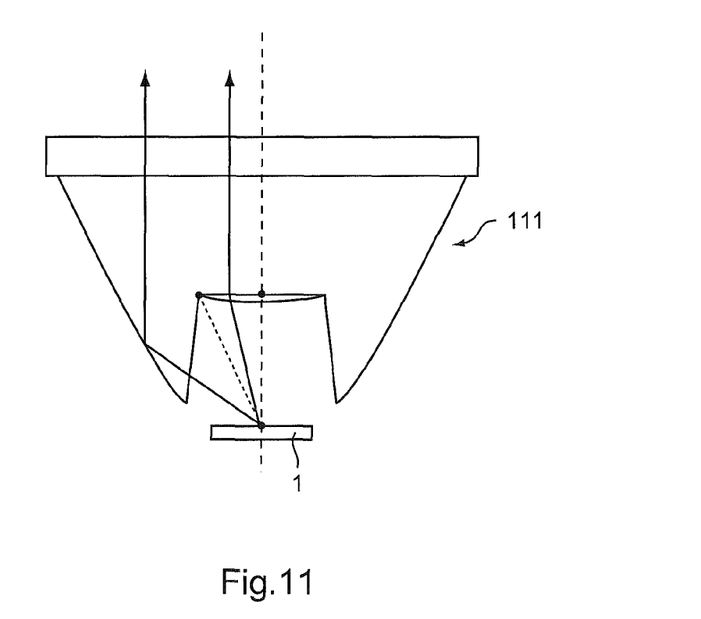
FIG. 11 is a view illustrating an optical system of the optical lens.

5. Further, although a case has been described above as an example where the light guide 121 of the optical lens 111 has the shape illustrated in FIG. 6A and FIG. 6B, the light guide 121 may have other shapes. In addition, with the shape of the light guide 121 illustrated in FIG. 6A, light emitted in a peripheral direction is also absorbed as illustrated in FIG. 11, and therefore unevenness in yellow color is easily produced. Consequently, according to this shape, it is possible to provide an effect of reducing unevenness in color.

6. The present invention is by no means limited to the above embodiment as is, and can form various inventions by modifying and embodying components without deviating from the spirit of the present invention at the stage of implementation, and adequately combining a plurality of components disclosed in the above embodiment. For example, some components may be removed from all components described in the embodiment. Further, components between different embodiments may be adequately combined.

The invention claimed is:

1. A white LED lighting device comprising a white LED and an optical lens arranged such that respective optical axes substantially match, wherein:
the white LED includes: a LED chip which emits light having a peak wavelength in a wavelength range of blue; and a fluorescent material which is excited by emission light of the LED chip and converts a wavelength into fluorescence of a color tone of yellow or greenish yellow which is a complementary color of blue;
the optical lens has: a light incident portion which allows the emission light to be incident from the white LED; and a light radiating portion which emits light to an outside, and is formed with a scattering guide which is given uniform scattering power in terms of a volume; and
the scattering light guide includes scattering particles most of which have a predetermined particle diameter for the scattering efficiency upon the scattering power in a short wavelength range of light to be higher than that in a long wavelength range of light;
wherein the light incident portion has a concave shape on a side of the white LED; and
a convex lens is disposed in an upper surface of the concave shape, and a tapered surface is formed on a side surface of the concave shape to widen toward the white LED.

2. The white LED lighting device according to claim 1, wherein a degree of multiple scattering n represented by multiplying a turbidity $\tau$ of the scattering light guide and a thickness M of the optical lens is, 0.1 to 50.

3. The white LED lighting device according to claim 1, wherein a planar lens, a convex lens, or a concave lens is disposed in an light emitting surface.

4. The white LED lighting device according to claim 1, wherein a curved surface which totally reflects emission light from the white LED is formed in a side peripheral surface of the optical lens.

5. The white LED lighting device according to claim 1, wherein a relationship between a ratio of a color temperature Tc in a center portion and a color temperature Tr in a peripheral portion of emission light and a ratio of a scattering efficiency Q(R) in the long wavelength range and a scattering efficiency Q(B) in a short wavelength range is $0.75<(Q(B)/Q(R))*(Tr/Tc)<1.25$.

6. The white LED lighting device according to claim 5, wherein the particle diameter of the scattering particles is 2 µm to 4.5 µm.

7. An optical lens in which a LED chip which emits light having a peak wavelength in a wavelength range of blue and a white LED including a fluorescent material which is excited by emission light of the LED chip and converts a wavelength into fluorescence of a color tone of yellow or greenish yellow which is a complementary color of blue are arranged such that respective optical axes match, wherein
the optical lens has: a light incident portion which allows the emission light to be incident from the white LED; and a light radiating portion which emits light to an outside, and is formed with a scattering guide which is given uniform scattering power in terms of a volume; and
for scattering power given to the light scattering light guide, a scattering particles diameter which includes a higher scattering efficiency in a short wavelength range of light than a scattering efficiency in a long wavelength range of light is selected;
wherein the light incident portion has a concave shape on a side of the white LED; and
a convex lens is disposed in an upper surface of the concave shape, and a tapered surface is formed on a side surface of the concave shape to widen toward the white LED.

* * * * *